United States Patent [19]

Bajorek et al.

[11] 4,328,530
[45] May 4, 1982

[54] MULTIPLE LAYER, CERAMIC CARRIER FOR HIGH SWITCHING SPEED VLSI CHIPS

[75] Inventors: Christopher H. Bajorek, Goldens Bridge, N.Y.; Dudley A. Chance, Danbury, Conn.; Chung W. Ho, Chappaqua; David A. Thompson, South Salem, both of N.Y.

[73] Assignee: International Business Machines Corporation, Armonk, N.Y.

[21] Appl. No.: 164,119

[22] Filed: Jun. 30, 1980

[51] Int. Cl.³ .............................................. H05K 1/18
[52] U.S. Cl. .................................. 361/308; 361/309; 361/395; 361/401
[58] Field of Search ............... 361/308, 309, 310, 407, 361/392, 395, 401, 406, 415, 416

[56] References Cited

U.S. PATENT DOCUMENTS

| | | | |
|---|---|---|---|
| 3,187,242 | 6/1965 | Schick | 361/308 |
| 3,290,756 | 12/1966 | Dreyer | 361/401 X |
| 3,356,786 | 12/1967 | Helms | 361/416 X |
| 3,896,354 | 7/1975 | Coleman | 361/303 X |
| 3,983,458 | 9/1976 | Jordan | 361/401 |
| 3,992,761 | 11/1976 | McElroy | 361/309 X |
| 4,059,849 | 11/1977 | Mitchell | 361/395 |
| 4,222,090 | 9/1980 | Jaffe | 361/401 X |
| 4,237,522 | 12/1980 | Thompson | 361/395 X |

OTHER PUBLICATIONS

R. H. Katyl, Edge-Mounted Hall Cell Sensor, IBM Tech. Dis. Bull., vol. 22, #8A, Jan. 1980, p. 3165.

*Primary Examiner*—Richard R. Kucia
*Attorney, Agent, or Firm*—Graham S. Jones, II

[57] ABSTRACT

A module carrying microcircuit LSI chips includes stacks of parallel ceramic sheets carrying thin capacitor plates laminated in a ceramic structure in which the capacitor plates either serve (1) as the power distribution conductors known as power planes or (2) are connected to power conducting vias which pass through the capacitor plates. Those vias connect to the appropriate capacitor plates electrically, thereby locating the capacitance required as close as possible to the solder bonds between the chips and the carrier. Stacks of laminated ceramic capacitors serving as power planes can be inserted into slots in laminated ceramic sheets providing the first arrangement above. Signal vias are provided about the periphery of the power planes. A highly parallel distribution of current is provided by means of horizontal power conducting straps which reduce voltage fluctuations, electrical resistance, and current per via.

11 Claims, 15 Drawing Figures

MULTIPLE LAYER, CERAMIC CARRIER FOR HIGH SWITCHING SPEED VLSI CHIPS

DESCRIPTION

1. Technical Field

This invention relates to high capacitance chip packaging structures and more particularly to such structures having parallel power supply conductors for supplying and smoothing power to the electrical connections to VLSI chips.

2. Background Art

A copending U.S. patent application Ser. No. 53,660 filed June 29, 1979 now U.S. Pat. No. 4,237,522 of Thompson entitled "Chip Package with High Capacitance, Stacked VLSI/ Power Sheets Extending Through Slots in Substrate" describes a packaging module for VLSI chips of very high densities. A substrate is milled to provide a number of slots. Into each slot a stack of several capacitively coupled, insulated power sheets is inserted. The power sheets connect power to the chips from the bus lines and the capacitances of the sheets provide the function of filtering to stabilize the power supply for the VLSI chips. The upper edges of the power sheets are arranged flush with the top of the substrate so that the edges themselves form land areas upon which a chip connector can be fastened. Alternatively, an interconnection layer can be disposed between the top edges of the sheets as well as to the surface of the substrate and the chip connectors. The lower portions of the power sheets extend below the substrate to provide connection tabs and decoupling capacitor connection tabs.

Another copending U.S. patent application Ser. No. 53,497, filed June 29, 1979 of Miersch & Romankiw entitled "Thin Film Metal Package for LSI Chips" describes a chip packaging carrier wherein several power conducting carrier plates are stacked parallel to the surface upon which the chip terminals are connected electrically to pads. The planes are extensive in area and dielectric material is present in the spaces between the parallel plates. Thus, high capacitance is afforded by such a structure. However, it is complicated to supply a large number of connections from the plates to the chips because numerous connections must be made through the parallel plates of metal up to the connection pads on the top surface of the packaging carrier.

U.S. Pat. No. 3,312,870 of Rhoades shows an electrical transmission system with parallel conductive plates having insulated outer surfaces, forming a laminated structure. The structure is stated to have a low reactance. In connection with FIGS. 7 and 8 it is suggested that the circuit board for electronic computers can be built to incorporate parallel conductive plates with separate pins secured to either of the two sets of plates. There are two plates connected together which supply current in one direction between which is sandwiched a conductive plate for carrying current in the opposite direction. No suggestion is made of use of ceramic material laminated with thin metallic films. Conductive plates are oriented at right angles to the laminated structure of the substrate. Provision of vias about the periphery of the structure is not suggested nor is provision of conductive straps and pins. Connection of vias up to transverse straps also is not suggested.

U.S. Pat. No. 3,663,866 of Iosue et al. entitled "Back Plane" describes a substrate for an array of microcircuit chips which shows an array of chips 44 in FIG. 2 adjacent to connection pins 38 which extend up from a stack of power conducting plates 34 which are connected to the leads of the chips by means of wire wrap connections. However, the chips are located upon the lower section of the substrate and their leads extend up through the substrate for connection to the terminals 48 by means of wire wrap connections 50.

U.S. Pat. No. 3,499,219 of Griff et al. for "Interconnection Means and Method of Fabrication Thereof" shows a stack of electrically conductive plates supporting an elongated conductive island within dielectric to form a coaxial transmission line within the plate.

An object of this invention is to provide an integrated ceramic carrier for electronic circuit chips. The carrier includes power distribution circuits having high capacitance and low inductance and includes interconnections provided to the chips between the chip terminals and the power distribution elements.

Another object of this invention is to provide a highly efficient power distribution circuit for a plurality of chips built into a chip carrier with short paths between chip power terminals and power distribution planes with maximum distributed capacitance throughout the power distribution structure.

Another object of this invention is to provide internal via interconnections with controlled electrical impedance through the structure for electrical signals to travel away from the structure through electrical terminal pins.

An object of this invention is to provide an improved chip packaging structure with satisfactory dielectric constant material or materials, mechanical strength, hermeticity, stability and compatibility with other materials to be joined together.

Another object of this invention is to provide a structure which is particularly adapted to manufacture in connection with the feature of placing parallel power plates or power planes through a slot in a substrate.

In accordance with this invention, a module for supporting electronic circuit chips in a circuit includes a planar ceramic substrate having first and second opposed surfaces. The first surface is adapted for carrying integrated circuit chips. A plurality of electrically conductive strips within the substrate is parallel to the surfaces of the substrate. The strips are employed for electrical interconnection to integrated circuit chips on the first one of the opposed surfaces. A plurality of stacked capacitive elements is contained within the substrate, composed of a plurality of laminated thin metallic sheets and a plurality of thin layers of dielectric material. A plurality of conductive planes extends between the opposed surfaces including within the planes distributed electrical conductive means for providing electrical connection from the second surface of the substrate opposite from the chips to respective ones on the side of the conductive strips for providing electrical power and signal connections to the chips. Respective elements in the stack of capacitive elements are electrically connected to respective ones of the plurality of conductive planes whereby the capacitive coupling between adjacent conductive planes is high.

Further, in accordance with this invention, each of the conductive planes is composed of a single metallic sheet. The sheets are inserted within a slot within the substrate with the conductive sheets sandwiched with dielectric whereby the conductive sheets form the stacked capacitive elements. Preferably, the conductive sheets are flat, having large parallel surfaces. The sheets have high electrical capacitance between adjacent ones thereof and minimal inductive coupling therebetween, with the edge surfaces of said sheets facing outwardly from the slot.

Still further in accordance with this invention, the conductive planes are composed of a series of thin elongated conductors in an array generally within the plane extending up into contact with the strips, respectively. The stacked capacitive elements extend parallel to the first and second surfaces of the substrate. The thin elongated conductors extend through the stacked capacitive elements with a plurality thereof being in electrical contact with a predetermined one of the capacitive elements with all in a single plane being connected to the same capacitive element and the same electrically conductive strip.

In accordance with this invention, a packaging module for electronic circuit chips includes a planar substrate having a pair of opposed surfaces, a plurality of stacked power distribution elements, a plurality of land areas on a level adjacent to that of one surface of the substrate for the means for interconnection to said chips. The stacked power distribution elements are composed of a plurality of parallel, flat sheets having edges and large parallel surfaces with material between the sheets and with high electrical capacitance between the elements and minimal inductive coupling therebetween, with at least one slot extending within the substrate between the opposed surfaces. The slot contains a stack of such elements extending therethrough with edge surfaces thereof facing outwardly through an opening of the slot and with at least some of the elements electrically insulated from the substrate. The improvement comprises having the sheets composed of dielectric material with the material between the sheets comprising a thin film deposit of a metal, and a high electrical capacitance existing between the thin film metal deposits. The substrate comprises a stack of laminated ceramic sheets.

DESCRIPTION OF THE PREFERRED EMBODIMENT

In packaging of high speed switching "Large Scale Integration" (LSI) semiconductor circuit chips on a chip carrier, the fluctuation of power supply voltages as a function of switching current and the inductive coupling of voltages because of extremely high transients in switching currents can cause severe reliability problems. Certain special measures can be taken to prevent those effects from occurring. Previous solutions have included building capacitors into the carrier to provide decoupling of switching currents from the power supply. In addition, chip interconnections have been provided on the top surface of the chip carrier in the form of thin film conductors.

Figure 8:
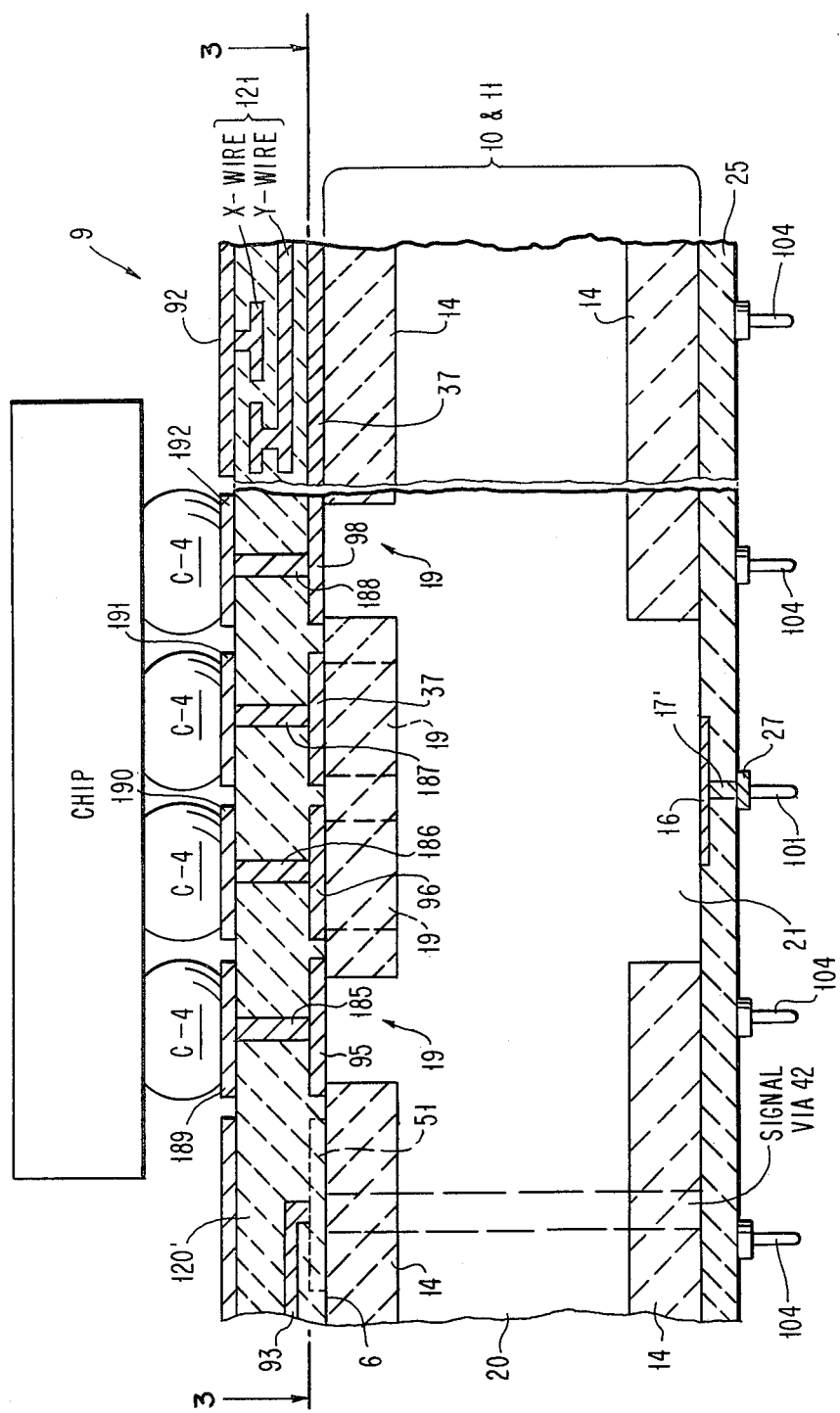
FIG. 8 is a sectional view of the complete vertical plate structure of FIGS. 1-3 taken generally along line 8—8 in FIG. 1.

Reference is made to FIG. 8 for an overall concept of a cross-section of the construction of a chip carrier 9 in accordance with this invention. A semiconductor electronic chip with C-4 solder bonds is shown with its C-4 bonds supported upon pads or lands 189, 190, 191 and 192 which are thin films of metal supported upon a dielectric substrate layer 120' (glass, polyimide, glass ceramic or equivalent). Within layer 120' are located x and y direction wiring lines for interconnection of the chips. Y interconnection line 93, (shown in phantom) connects on the left through circular via tab 51 and through via 42 (shown in phantom) down through further layers of dielectric and between several parallel power planes 20 of metal. The signal via 42 is composed of a metal cylinder formed in layers of ceramic material. One of many parallel, capacitively coupled power planes 20 is shown with its upper projection tabs 19 reaching up to strip connectors 95 and 98. Connectors 95 and 98 are portions of the same voltage plane (see FIG. 3). Connector straps 95 and 98 reach back into the page to contact other projecting tabs 19 extending from parallel power planes 20 (not shown) for providing a highly parallel structure of electrical interconnections of the tabs 19. Straps 95 and 98 and the like supply electrical current to the chips where required from the power planes 20 which are connected to external power supplies as will be explained further in connection with FIG. 1. The electrical connections to the C-4 bonds are provided by means of electrically conductive vias 185, 186, 187 and 188 from strap connectors 95, 96, 37 and 98 respectively which are shown running in parallel looking back into the page in FIG. 8 and which are connected to respective tabs 19 some of which are shown in phantom. The vias 185-188 are connected to pads 189, 190, 191 and 192 which are actually connected to the individual C-4 joints. In accordance with this invention, different integrated electrical structures are employed to achieve capacitive and inductive decoupling of the chips in order to reduce problems associated with current surges caused by the rapid and sometimes simultaneous switching of the various myriad circuits contained with the extremely small but densely populated circuits of the chips carried upon the structures.

Figure 1:
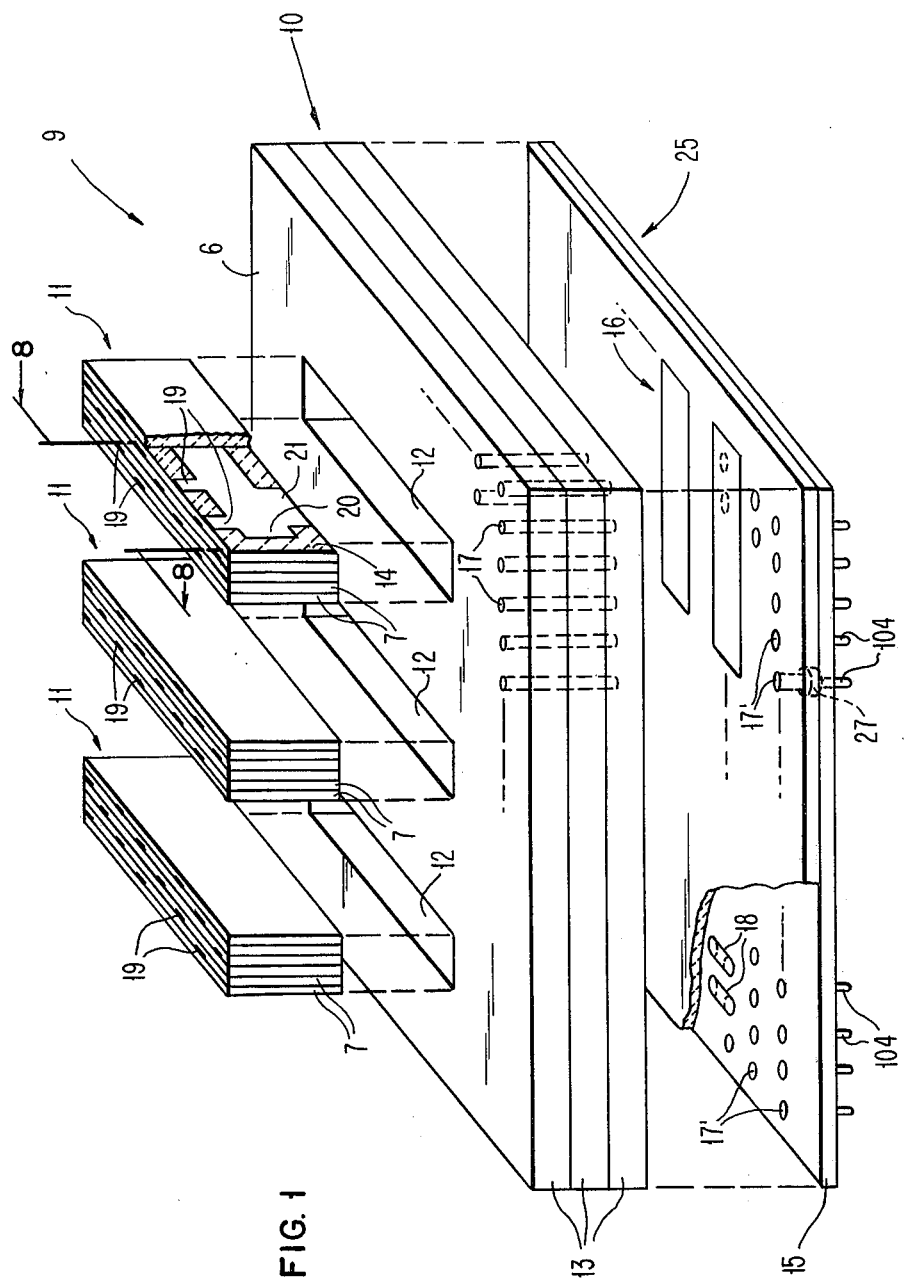
FIG. 1 is a perspective view of a lower portion of a chip carrier in accordance with this invention.

In FIG. 1 an exploded perspective view of an integral chip carrier module 9 is shown including only portions of the structure of FIG. 8 with the chip and upper layers (including ground plane plate 37 and layers above it) removed from the carrier. A laminated ceramic substrate 10 is composed of a stack of horizontally oriented ceramic sheets 13 which are laminated together. Substrate 10 provides the bulk of the basic support for the structure. Several slots 12 are provided in the substrate 10 extending through from the top to the bottom of the stack 10 of sheets 13. A plurality of sets of vertically oriented stacks 11 of ceramic sheets bearing metallic capacitor plates are inserted into the slots 12. Vertical, capacitor stacks 11 serve the function of providing power supply connections between the upper and lower portions of carrier 9. Carrier 9 also includes signal and power vias and pins for external connections.

Stacks 11 are laminated structures each of which is composed of numerous laminates 7 comprising ceramic substrates 8 (FIG. 2) carrying alternating laminated layers of metallic, power plane conductors 20 and ceramic or dielectric sheets 14. The stacks of laminates 7 in capacitor stack 11 are oriented so their edges extend vertically when they are inserted within the slots 12 in substrate 10. The horizontal sheets 13 in stack 10 of ceramic material include all about their periphery and between the slots 12 a matrix of vertically extending electrical conductors in the form of vias 17 composed of metal. The vias 17 serve as conductors for transmitting signals and power supply voltages to chips from sites not on the module. Vias 17 are interspersed with other vias connected to a reference voltage in a manner equivalent to annular coaxial transmission lines and vias 17 preferably have a fifty ohm characteristic impedance value.

The lower stack 25 of laminated horizontal sheets 15 located below substrate 10 and parallel to sheets 13 thereof is unslotted and is also constructed basically of ceramic material. Upon the uppermost sheet 15 of stack 25 is deposited an array of metallization straps 16 adapted to electrically interconnect the lower tabs 21 of the various metallic power supplying, power planes 20 in laminates 7. Such interconnection is used for distribution of electrical power from the straps 16 up to the power planes 20 which connect electrically, (as described in connection with FIG. 8) to the chips. Straps 16 are also connected electrically to vias 17' beneath them. Vias 17' supply power from conventional connector pins 104 connected to metal pads 27 beneath the vertically extending vias 17' which project through the layers 15 from top to bottom. The connector pins 104 are preferably bonded by brazing to the metallic pads 27 in the conventional fashion. Layers 15 also include redistribution metallization tabs 18 cooperating with vias 17' for redistribution of signals and power to the via grid 17 above and 17' below. The vias 17 and 17' are electrically connected where desired, when the structure is assembled by means of heat treatments which will be explained below. Alternative metal joining techniques obviously can be employed.

Figure 3:
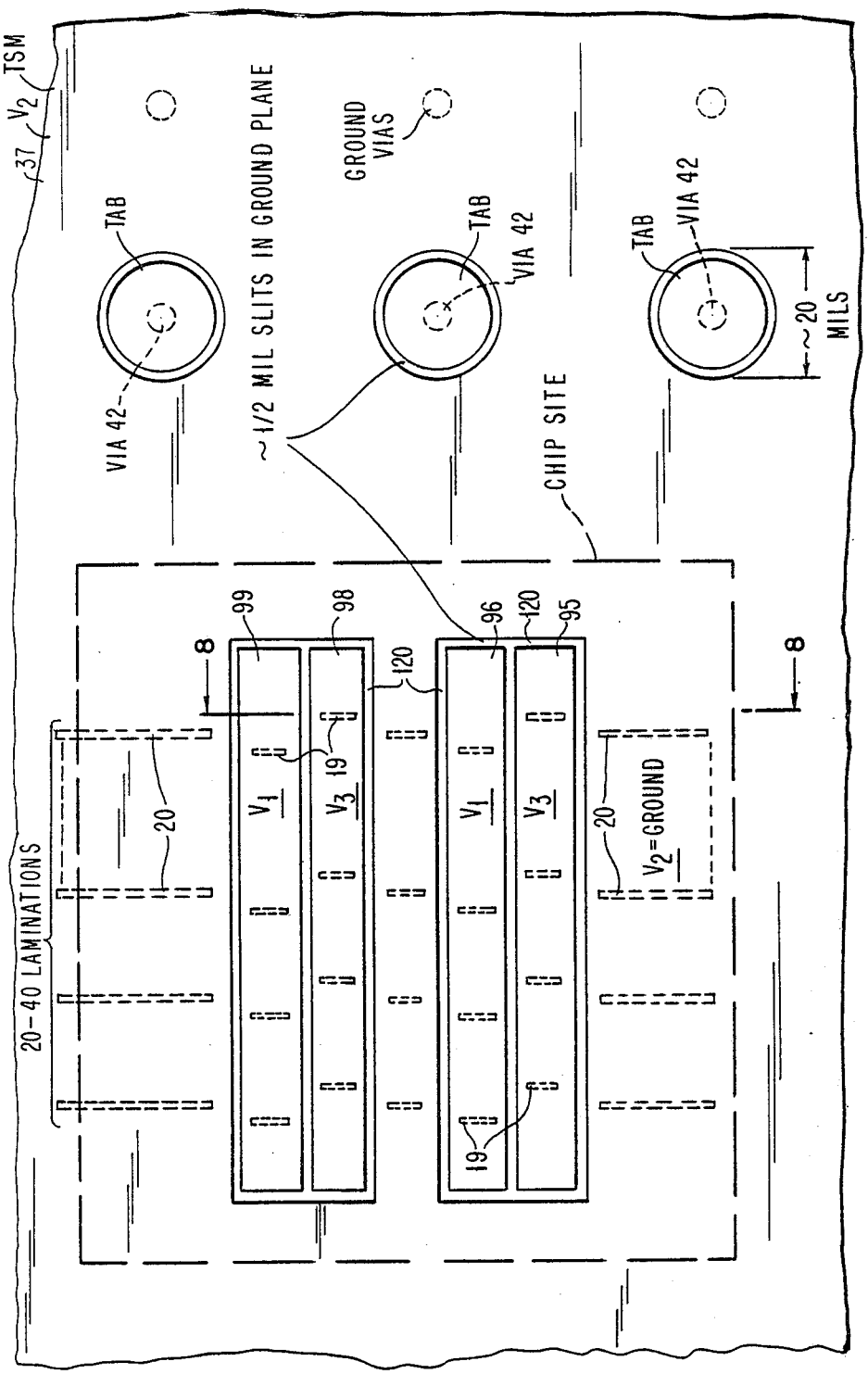
FIG. 3 is a plan view of the chip carrier of FIG. 1 with a thin film ground plane applied upon the upper surface of the assembled structure preparatory to addition of the vias and x and y wiring planes taken along line 3—3 in FIG. 8.

Metallic tabs 19 on the tops of the power planes 20 and dielectric (ceramic) interface (connect directly electrically and mechanically) with a ground plane 37 (FIGS. 3 and 8) and a set of slotted thin film conductors 95, 96, 98 and 99 on the top surface 6 of substrate 10 and stacks 11 as can be seen in FIGS. 3 and 8. The slits of dielectric 120 between the ground plane 37 and conductors 95, 96, 98 and 99 (seen in FIG. 3) serve to separate the metallization of plane 37 and the conductors into separate terminals at different voltages to provide different electrical connections as explained in detail in connection with FIG. 8 and below.

A process for the fabrication of the elements in FIG. 1 is as follows:

(1) The dielectric sheets 8 and 14 (FIG. 2) in stacks 11, the dielectric ceramic sheets 13 in substrate 10 and the dielectric sheets 15 in horizontal stack 25 are formed with ceramic green sheet (uncured ceramic) material. The vertical sheets 8 and 14 in sublaminates 7 carry metal for power planes 20 which serve as capacitive electrodes as is explained further in greater detail in connection with FIG. 2. Then the layers of sublaminates 7 are laminated together at about 75° C. and 10,000 psi pressure. Then the laminated layers of sublaminates 7 are cut to the desired size. Horizontal sheets 13 and 15 must have holes for vias punched in them and then they are filled with metallization.

(2) Assemble the parts 11, 10 and stack 25, in green form and press to laminate a second time.

(3) Cut to size and sinter the assembly at a temperature from 900° C. (glass ceramic) to 1560° C. (alumina).

(4) Grind the top surface 6 of substrate 10 and stacks 11 (edges) to grind down to the tabs 19 to expose them for electrical connection.

(5) Deposit a thin film multiple layer structure upon the top surface 6, to provide ground plane 37 and thin film x and y metallization lines, engineering change pads and the like.

Alternatively, the structure can be assembled by the process which follows:

(IA) Build up elements 10, 11 and 25 with appropriately metallized green sheets (as in 1 above) and laminate them separately. Cut and punch to form the desired shape.

(IIA) Sinter the laminated elements 10, 11 and 25 separately.

(IIIA) Employ glass and brazing metals to join elements 10 and 11 together with element 25.

(IVA) Grind the top surface 6.

(VA) Provide top surface metallization (TSM) such as wiring layers and engineering change layers by means of a thick film process, or deposit the thin film structure as in 5 above.

Figure 2:
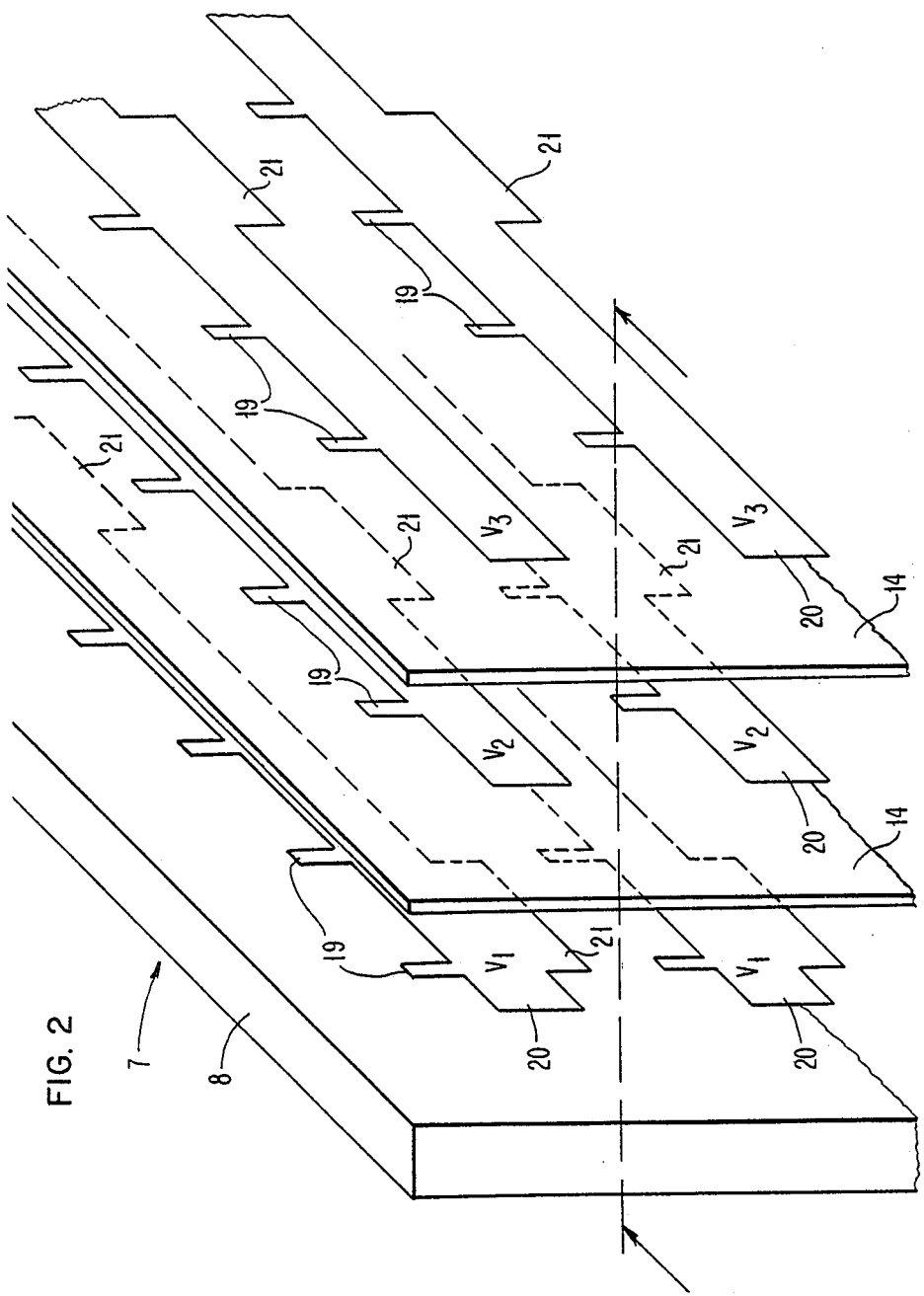
FIG. 2 is an exploded perspective view of a partially fabricated portion of the carrier of FIG. 1.

Modifications in the basic process are possible in order to achieve the same structure, as known to those skilled in the art. The ceramic-metallized capacitor stacks 11 are shown in FIG. 2 in an exploded form with several stacks being fabricated at once. Ceramic sheets 8 and 14 serve as dielectric and the metallization of power planes 20 provides capacitance as well as conducting current to supply power to the chips. Since the metallization of power planes 20 does not need to be interconnected with other such layers 20 directly within the stack 11, many deposition techniques are appropriate for depositing the metal upon the unfired green sheets 8 and 14 of ceramic material. Sheets 8 and 14 may be coated with metal layers 20 by means of spraying, screening, tape transfer or casting from a slurry, etc. Metallization 20 requires some pattern definition so screening may be the preferred deposition method.

The Top Surface Metallization (TSM) tabs 19 are used for contacting the metal (TSM) layer 37 on top of the stacks 11. Similarly the Bottom Surface Metallurgy (BSM) tabs 21 are used for contacts to the power plane strap metallization 16 on the upper surface of lower stack 25, which metallization 16 contacts the lower surface of the tabs 21 of capacitor stacks 11. Thus, the power planes 20 serving as capacitor stacks can be interconnected by means of straps 16 to connector pins 104 on the lower surface of the stack 25. Next the green sheets are stacked and laminated.

In FIG. 2 which illustrates how to assemble sublaminates 7 from large green sheets 8 and 14, the structure shown includes two sequences of metallization above and below the plane of the dotted line indicated in the foreground of the drawing. That plane indicates the line along which the green sheets are to be cut to achieve capacitor stacks of FIG. 1 subsequent to lamination. The sheets are cut prior to firing the ceramic material. It can be seen that on each green sheet 8 or 14 there are at least two sets of metallization 20 and the graphic indication is that the green sheets are cut off at the bottom to illustrate the fact that many sets of narrow strips forming power planes 20 are laminated at a time prior to cutting and firing. In this way, manufacturing efficiency is achieved as a number of metallization patterns can be fabricated upon a large green sheet at one time. Then the stacks 11 of green sheets with metallization can be cut (horizontally as indicated by the dotted line) from uncut sheets 8 and 14 which have been properly aligned and laminated prior to firing. In other words many sets of power planes 20 can be fabricated simultaneously. Then they are processed as above. After cutting, the capacitor stacks 11 are inserted into the slots 12 in the stack 10, above the redistribution layers 15 in stack 25. Then the sheets 13, the inserted capacitor stacks 11 and the bottom redistribution layers 15 in stack 25 are laminated together to obtain a cohesive unit. Alernatively, the substrate 10, capacitor stacks 11 and the bottom layers 25 can be fired separately as described above in process A and they are subsequently assembled together in a cohesive structure by a glassing technique for securing the capacitor stacks 11 in substrate 10 and by means of brazing of electrical connections of the metallization 20 to strap metallization 16 on top of the top layer 15.

It should be noted again with regard to FIG. 2 that each power plane 20 includes a series of tabs 19 on its upper edge which connect to the top surface metallurgy TSM 37 and the segments thereof labelled for voltages $V_1$ and $V_3$ (95, 96, 98 and 99 FIGS. 3 and 8) which are separate from ground plane voltage $V_2$ to which some of the tabs 19 are connected. As stated above, on the lower edges of the power planes 20 are tabs 21 which connect to the straps 16 on the upper sheet 15 in stack 25.

The upper layer of metal TSM 37, 95, 96, 98 and 99 (FIG. 3) on the top surface of the ceramic substrate 10 and the upper edges of stacks 11 is applied by plating, evaporation, etc. Layer 37, etc. is a continuous metallic plane of a thin metallic film present except at gaps between areas $V_1$, $V_2$ and $V_3$. The gaps between areas $V_1$, $V_2$, and $V_3$ are provided for electrical isolation. It connects by vias to the metallization above which connects to the chips as shown in FIG. 8 and it is electrically connected below to vias 17 as shown in FIG. 1 and FIG. 8 which shows a via connection 42 in phantom to metallization 51.

In FIG. 3 it can be seen that the metallic straps 95, 96, 97 and 98 in the plane of layer 37 labelled $V_1$ (96, 99) and $V_3$ (95, 98) which contact some of the tabs 19 are oriented to cross over the metallization of power planes 20 (shown in phantom) at right angles so that several power planes 20 are connected together electrically through their tabs 19 and straps 95–98. Alternate power plane sheets 20 are connected through tabs 19 to the various straps $V_1$, $V_3$ (95-98) and to ground plane $V_2$ with the capacitive connections between adjacent power planes 20 tending to reduce the voltage or inductive effect of electrical power surges from the chips connected to the chip carrier 9. The strips $V_1$ and $V_3$ should have sufficient width and length to contact the tabs 19 which are intended to be contacted without difficulties caused by the deviation of the location of the tabs 19 within the ceramic structure from the specified location. Such deviation from specifications is caused by the uneven shrinkage of the ceramic structure after firing of the ceramic green sheets. For example, a tolerance such as 0.03 mm per cm measured from the center of the substrate 10 can be employed as a rule of thumb.

Referring to FIG. 8 chip fan-out lines and pads for engineering change connections 92 and other interconnection lines 121 are fabricated above the level of the ground plane 37. Also, above the level of ground plane 37 are dielectric layers 120'and vias 185, 186, 187, and 188 through layer 120 connected respectively to circular surface pads 189, 190, 191, and 192 providing power for C-4 connections of the chips to the chip carrier. Dielectric is composed of appropriate materials such as polyimide, glass, etc. A technique of applying the interconnections is described by Duffek in "Electroplating the New Generation of Minielectronic Devices", Plating 56, 5, p. 505 (1969).

Referring now to the capacitor structure 11 of FIG. 8, for a 0.00254 cm thick insulating layer 14 with a dielectric constant of 10 in the 9 cm by 10 cm by 0.6 cm substrate size category, the amount of capacitance is:

$C = 8.85 \times 10^{-14}$ K A/t (nf) where

K = dielectric constant

A = area of electrodes (cm$^2$)

t = dielectric thickness (cm)

$$C = 10 \times 8.85 \times 10^{-14} \times \frac{9 \times 0.6}{0.00254} = 1.9 \text{ nf.}$$

With 105 such insulating layers sandwiched between 0.00127 cm thick conductive layers 20, the total capacitor has a thickness of approximately 0.4 cm and a total capacitance of 200 nf. Sharing the capacitance among ten chips, the capacitance per chip is 20 nf. Higher capacitances can be obtained by using glass ceramic materials instead of pure alumina or mixtures of ceramics with ferroelectric materials or other high dielectric constant oxides. Both can be made with dielectric constants greater than 10. Use of such materials makes it possible to match thermal expansivity of the substrate to that of the chips carried on the substrate. An optimum substrate can be obtained by using a high dielectric constant ceramic material in the capacitor stacks 11 and low dielectric constant ceramic materials elsewhere to reduce the flight time of electrical signals through the substrate. FIGS. 4-7 and 9 illustrate an alternative ceramic chip carrier construction in accordance with this invention in which the capacitive planes are built into the substrate employing the green sheets oriented horizontally in conventional fashion. The same arrangement of an integrated ceramic capacitor and signal vias is employed.

Figure 4:
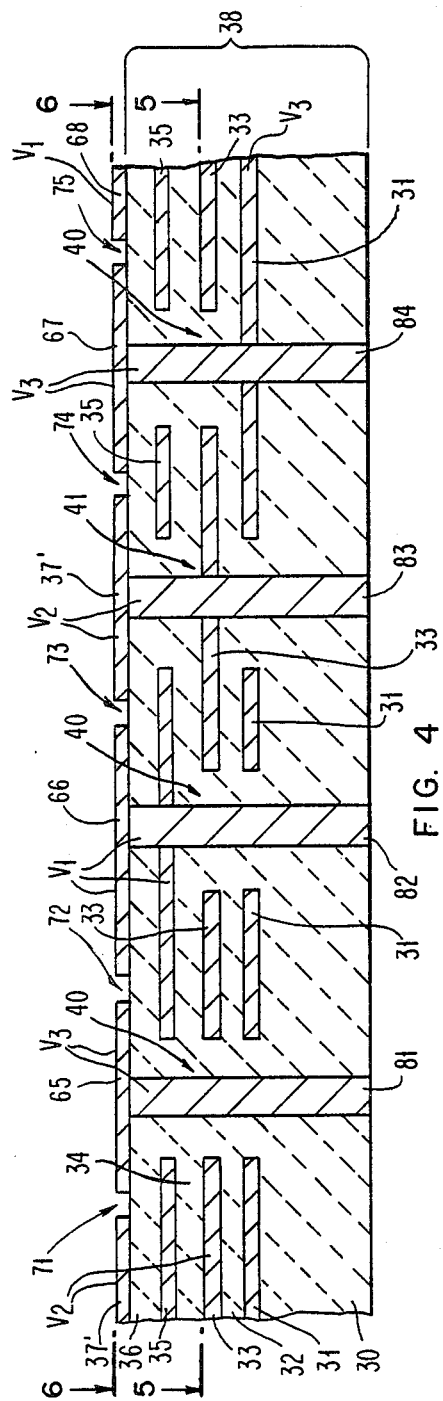
FIG. 4 is a sectional view of a section of a chip carrier subassembly into which capacitive elements have been incorporated, taken along line 4—4 in FIGS. 5 and 6.
Figure 6:
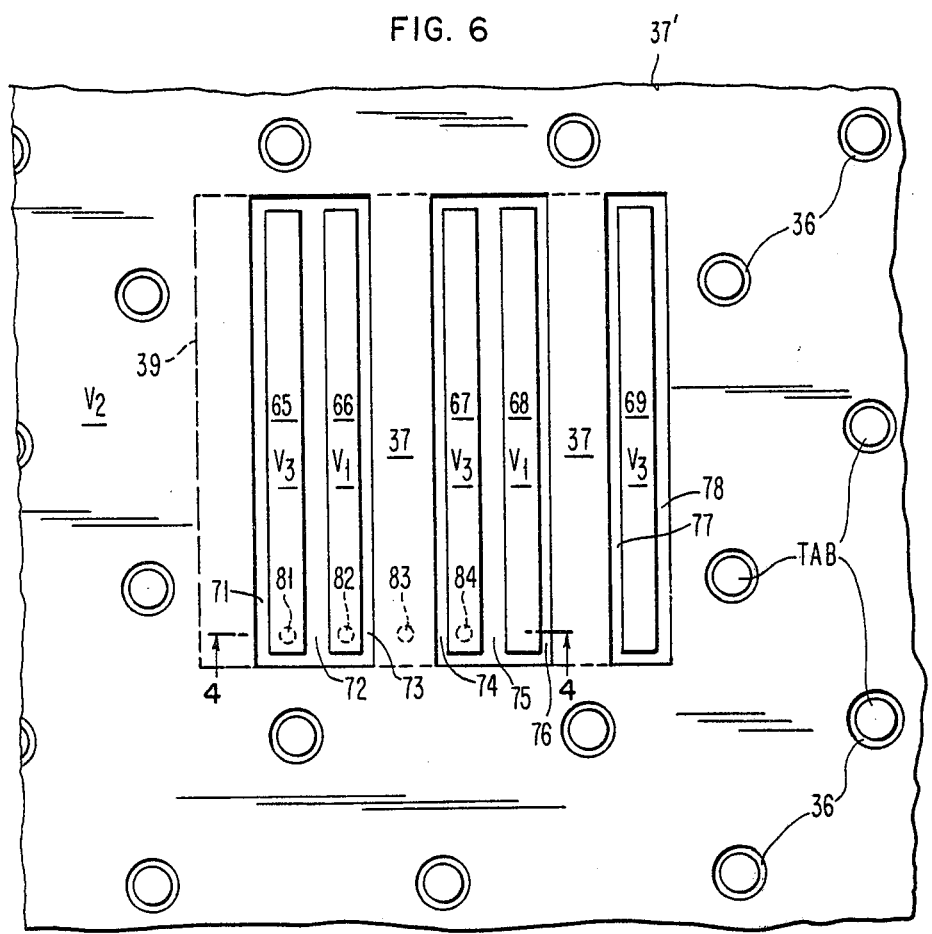
FIG. 6 is a plan view of the structure of FIG. 4.
Figure 9:
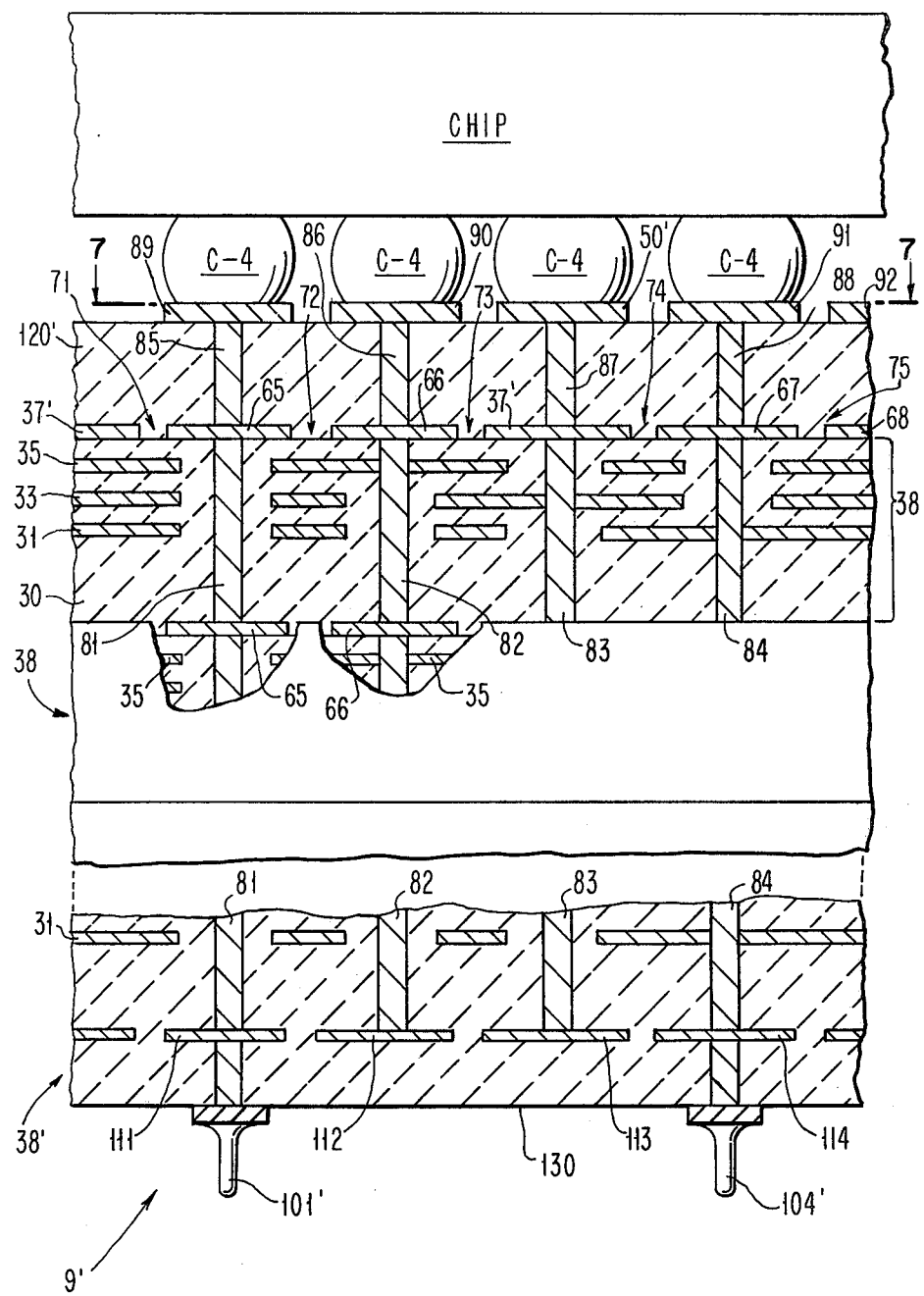
FIG. 9 is a sectional view of the complete horizontal plate structure of FIGS. 4-7 taken generally along line 9—9 in FIG. 7.

FIG. 4 is a cross-section of a structure referred to as a sublaminate 38 from the lower portion of a chip carrier 9' as shown in greater detail in FIG. 9. Sublaminate 38 includes ceramic dielectric substrate 30 with stacked laminated horizontal capacitive power planes 31, 33 and 35 connected in an array to conductive strips 65, 66, 37' and 67 (shown in a plan view in FIG. 6 taken along line 6—6 in FIG. 4) by means of conductive vias 40 and 41. (FIG. 6 is a section looking down on the structure of FIG. 4 from the top before any thin film layers are deposited upon the upper surface 37' (TSM)). One of the electrical vias 40, via 81 connects to strip 65 from an element below (not shown) which would be an element similar to strip 16 in FIG. 1 or an interconnection to another flat, capacitive sublaminate 38 (identical to that shown in FIG. 4) which can be stacked below this element 38 with one sublaminate 38 being essentially interchangeable with another, as illustrated in FIG. 9 with several sublaminates 38 stacked one upon the other.

Figure 5:
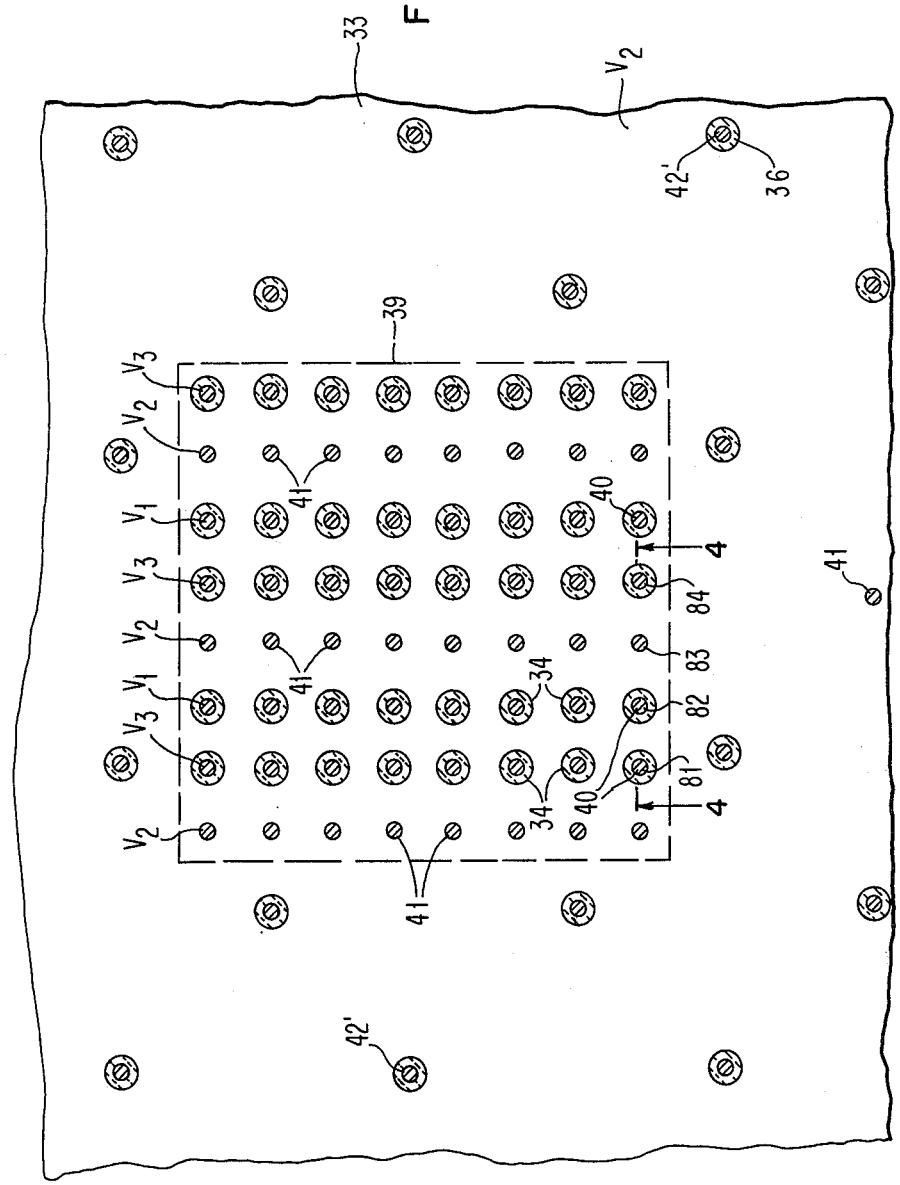
FIG. 5 is a sectional view of the substrate section of FIG. 4 taken along line 5—5 in FIG. 4.

FIG. 4 shows a section line 5—5 which indicates a cutting plane through the sublaminate 38 of FIG. 4 to show the section seen in FIG. 5 with the vias 40, 41 in section. Those vias 40 with circles (FIG. 5) indicating solid cylinders 34 of insulating material around them (including vias 81, 82 and 84) are insulated from the metallic capacitor plane 33 as shown in FIG. 4. The vias 41, including via 83 which are shown without any circles about them are directly connected to the capacitor plane 33 (voltage $V_2$). Referring to FIG. 4, one of the vias 40, via 81 is connected to supply voltage $V_3$ as is also indicated in FIG. 5 with the insulation 34 about via 81. Vias 82 (40) and 84 (40) are connected to supply voltages $V_1$ and $V_3$, respectively. Via 83 (one of the vias 41) is connected to supply voltage $V_2$ as is all of the capacitor plate 33. It can be seen in FIG. 5 looking from left to right that the vertical columns of vias are connected respectively to supply voltages $V_2$, $V_3$, $V_1$, $V_2$, $V_3$, $V_1$, $V_2$ and $V_3$.

The same pattern applies on FIG. 6 with respect to the alternation of the connections to supply voltage $V_1$, $V_2$, and $V_3$ in a repetitive sequence. A dotted line pattern 39 in FIGS. 5 and 6 indicates the region which is located directly below a chip site as shown in FIG. 9 which is far above the sheet 33. However, line 39 encompasses all of the vias with connections to the strips 65, 66, 67, 68 and 69 in FIG. 6. The tabs in FIG. 6 labelled TAB (for connection of signals to the chip fanout) are connected to other vias 42' in FIG. 5 which are surrounded by insulation circles 36 in FIG. 5 which illustrate that the vias are insulated from the ground plane 37'.

As shown in FIG. 4 fabrication of a subassembly 38 starts with a blank thick green sheet 30 on which is deposited a layer of metal 31. Next, about a 0.00254 cm thick ceramic layer 32 is applied on top of the metal 31 separating the layers. The lines are missing because after lamination and firing, the layers merge. The technique of application of metal to the ceramic layers is selected from screening or spraying a ceramic slurry, or laminating a green ceramic sheet or by applying a tape transfer. The process is repeated several times until a few (about three) layers (metal layers 31, 33, and 35 and 37' and ceramic sheet layers 32, 34 and 36) have been combined to form a subassembly 38. Subassembly 38 is thick enough (about 0.0254 cm) so that it can be punched with a matrix of holes which are filled with metal paste by conventional means. The vias 81, 82, 83 and 84 are power vias which connect to the desired power straps 65, 66, 37' and 67 as shown. Signal vias 42' are fabricated in a similar fashion. The appropriate ones of vias 81–84 also connect to the capacitor plates or sheets 31, 33, and 35 as explained above. The top ground plane layer 37' is further screened with a metal paste layer which serves the purpose of providing an additional metal layer which enhances the capacitance of the structure as well as facilitating electrical testing for short circuits, open circuits, and for enlarging the via dimension tolerances so that multiple assemblies can be aligned and laminated together to form the ceramic substrate subassembly 38.

With reference to FIG. 5, a top view of a power plane sheet 33 produced from a typical metal paste layer is shown. It is made in a similar manner to layers 31 and 35. Within the space directly below a chip site 39 (shown in phantom) each row of insulators 34 (about 0.033 cm) is designed to let a different power supply voltage pass through with adequate clearance for the mechanical punch and fabrication tolerances. The rows of vias 41 are the vias which contact this particular metal layer 33 which are punched and filled after a subassembly is fabricated as described above. The vias 42' adjacent to the area 39, defining the area directly below the chip site, are employed for the signals and also for the return current vias.

In FIG. 6, the top metal layer of the subassembly is shown including ground plane 37' and conductive straps 65–69. As can be seen, by superimposing FIG. 6 upon FIG. 5, the rows of power vias 40 or 41 for the same power supply are connected together to insure good electrical contact and to avoid problems of poor connection caused by misalignment. The spaces between the metal paste provide the needed clearance of the vias from each other.

Figure 7:
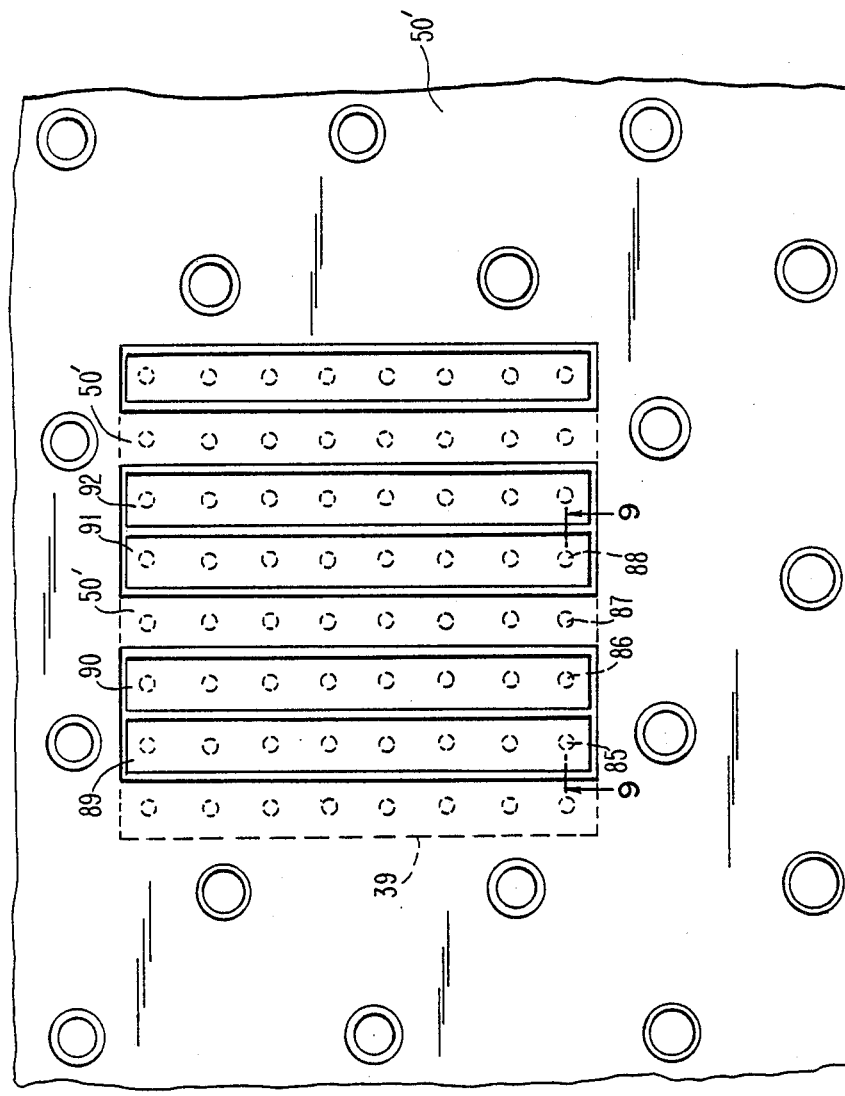
FIG. 7 is a plan view of the structure of FIG. 6 after additional thin film wiring planes have been added taken along line 7—7 in FIG. 9.

In FIG. 9 similarly to the first structure of FIGS. 1–3 and 8 the top surface of the substrate is metallized with a layer including plane 50' and straps 89–92 after firing in a subsequent step for deposited thin film layers as shown in FIG. 9. The pattern of metallization on top is shown in FIG. 7 which is taken along line 7—7 in FIG. 9.

For a 10 cm by 10 cm substrate carrying about 100 chips, a preliminary design indicates that an area of about 5.8 cm² must be excluded from the surface area useful for producing capacitance because of the disc shaped via openings in the sheets of metal. Accordingly, the total capacitance for 20 subassemblies of ceramic capacitors using insulating layers 0.0025 cm thick with a dielectric constant of ten and thirty-two dielectric layers per subassembly in the substrate is as follows:

$$C = 20\ 8.85 \times 10^{-14} \times 10 \times \frac{(100 - 5.8) \times 3.2}{0.00254} = 2100\ \text{nf}.$$

Therefore, each chip shares the capacitance with 21 nf per chip in an approximately 0.5 cm thick substrate. In both the vertical and horizontal structural embodiments, the chip carriers can be used as either single or multiple chip carriers.

FIG. 9 is a section of the chip carrier 9' of FIG. 7 taken generally along line 9—9 in FIG. 7. No modification is made in this drawing to illustrate thin film layers on the upper surface of the module. That will be understood with reference to FIG. 8. As in FIG. 8, in FIG. 9 the chip is mounted by means of C-4 solder bonds to an upper surface shown in FIG. 7 with pads which in this case are straps 89, 90, 50' and 91 preferably for unique connection to a particular part of a chip. The pads 89, etc. are connected by means of vias 85, 86, 87 and 88 through dielectric 120' to pads 65, 66, 37' and 67 as shown in FIG. 6. Pad 92 is shown resting above strap 68.

The pads 37', 65, 66 and 67 form the upper surface of one of the substrate assemblies 38 of FIGS. 4–7 which include a number of parallel layers of metallization forming capacitors 33, and 35 with the vias 40, 41 (such as 81, 82, 83 and 84) passing therethrough. Numerous substrate assemblies 38 are stacked upon a modified lower assembly 38' with vias 82 and 83 truncated so that there are no vias extending to the lowest surface 130 of the ceramic. In assembly 38' there are pins 101' and 104' connected to the base of vias 81 and 84, respectively, with numerous other pins arranged in a matrix represented by the two pins 101' and 104' shown. Thus, considerable capacitance is achieved by stacking the horizontal capacitors of FIGS. 4–7 which are connected to the vias to provide regulation of the current surges (di/dt) which would tend to modulate the voltages to the chips causing introduction of erroneous signals into the chip.

Figure 10:
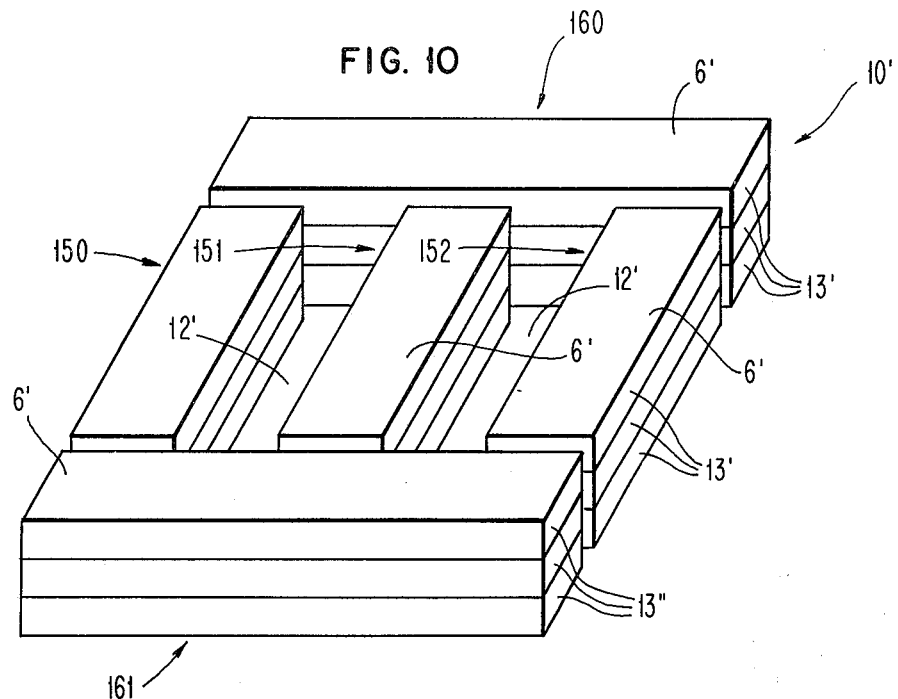
FIG. 10 is a perspective view of a modified ceramic substrate pattern shown in FIG. 1 arranged from building blocks of ceramic material to form a pair of slots.

FIG. 10 shows a building block or "brick wall" substrate 10' for constructing the laminated ceramic substrate 10 of FIG. 1. The technique is to laminate large area ceramic sheets 13' into layers, cut them into rectangular patterns of varying dimensions as required. The horizontal top and bottom members 160 and 161 are relatively longer in the arrangement chosen for FIG. 10 (although that is not the only way that the same structure can be achieved. Instead, three long parallel members can be bridged together by four small squares between the ends of the three members). In this case, the vertical members 150, 151, and 152 are shorter than the end members 160 and 161. It will be seen that the upper surface 6' is analogous to surface 6 in FIG. 1.

The structure of FIG. 10 is placed into a mold and a capacitor stack (not shown for convenience of illustration) analogous to stacks 11 in FIG. 1 is inserted into each slot 12'. Then the structure is laminated by means of application of pressure and heat to form a cohesive unit.

Figure 11:
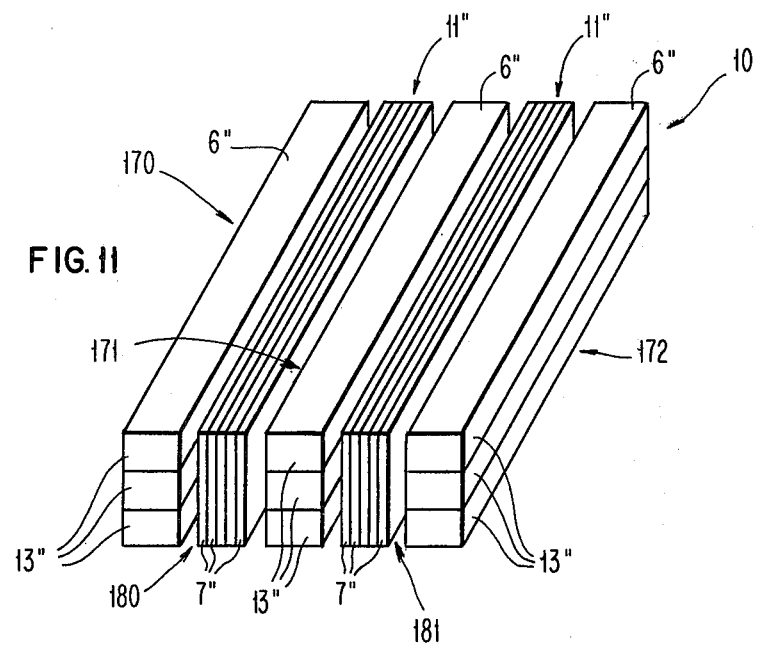
FIG. 11 is a perspective view of another modified ceramic substrate pattern without slots.

FIG. 11 shows another alternative similar to FIG. 10 for FIG. 1 in which the substrate 10 is composed of three laminated ceramic legs 6" or 170, 171, and 172 which are fabricated similarly to the members 150, 151, 152, 160 and 161 in FIG. 10. Then between the tree legs are inserted two capacitor stacks 180 and 181 or 11" composed of sublaminates 7" which are analogous to stacks 11 and sublaminates 7 in FIG. 1. Again, the elements can be assembled in a brick wall approach. As will be obvious from study of FIG. 1, the structure can be made to be very similar to the final construction of FIG. 1 or the like. The separate elements will be joined during the firing to produce a single unified structure with the separate elements integrally joined together.

Figure 12:
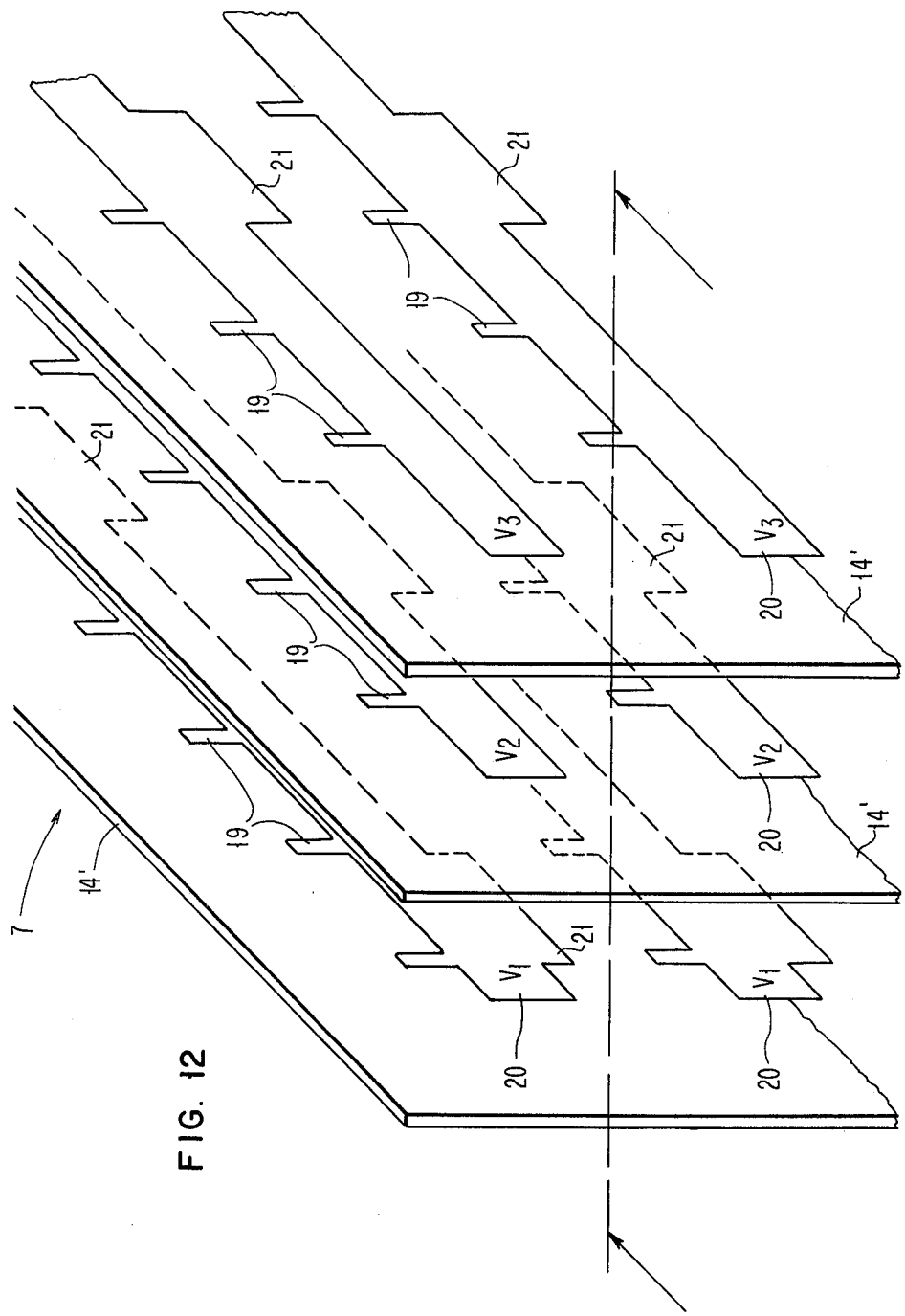
FIG. 12 is a perspective view which shows a modification of FIG. 2.

FIG. 12 shows a similar view to FIG. 2 wherein the support for the sublaminate 7 has been modified by removing the thich substrate 8 and substituting a thin ceramic sheet 14' for it. Then the remaining structure is assembled by screening metal layers $V_1'$, $V_2$, and $V_3$ onto the succeeding ceramic sheets 14' which are added to the structure after each succeeding layer has been metallized. The layers 14' can be about 0.02 mm to 0.1 mm thick.

Figure 13:
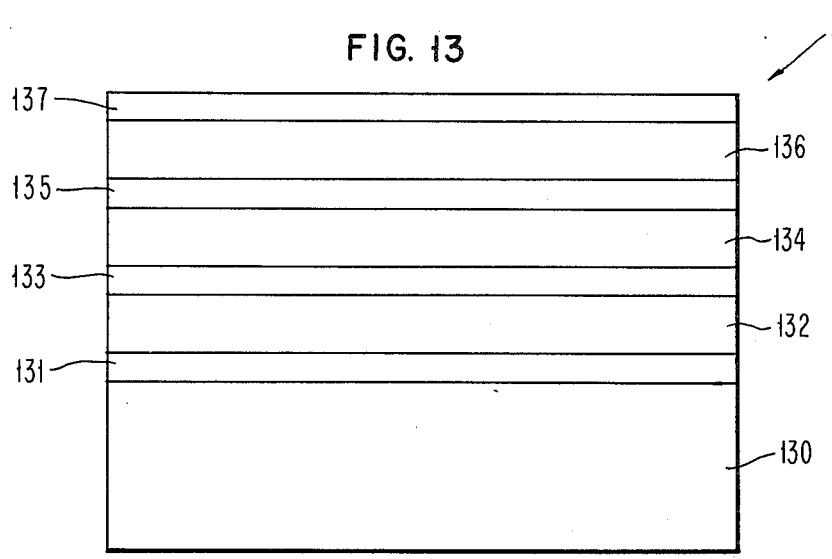
FIG. 13 is an end view of an oversimplivied sketch of a sublaminate structure showing a modification of FIG. 4.

FIG. 13 shows a modified construction 38' for the sublaminates 38 of FIG. 4. A thick ceramic base layer 130 of uncured ceramic green sheet material is used as a support for a laminated structure of thin metallic layers 131, 133, 135, and 137 which are analogous to layers 31, 33, 35, and 37 in FIG. 4. The metallic layers are applied by screening on thin layers upon the layer below. Between the metallic layers are ceramic layers 132, 134, and 136 which are analogous to layers 32, 34, and 36 in FIG. 4.

FIG. 13 can be fabricated by means of a different process starting with the thick sheet 130 and screening on the metallic paste for layers 131, 133, 135 and 137 as above but applying three thin green sheets 132, 134, and 136 which have been screened independently either in parallel steps or serially as the sheets lie in place. The thick layer 130 provides rigidity. The structure is laminated in any event. After lamination, the layers can be punched to provide holes into which metallic paste can be inserted to form vias.

Figure 14:
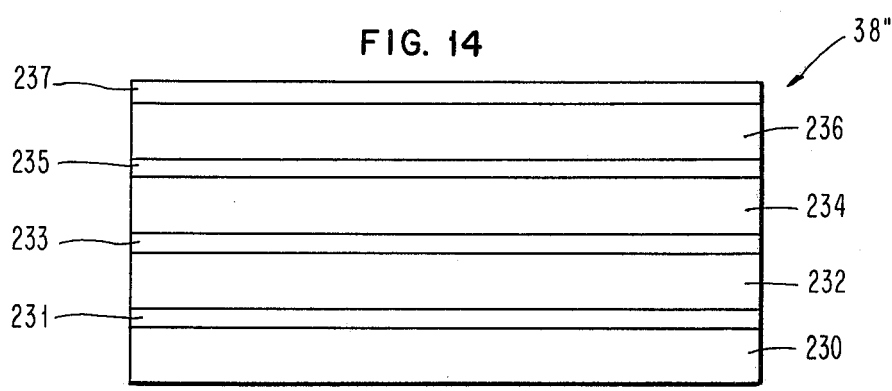
FIG. 14 is a modification of FIG. 13.

FIG. 14 shows an alternate structure 38'' for a sublaminate wherein the layers 230, 232, 234 and 236 are all thin layers of ceramic material preferably in the form of thin green sheets. The four layers of metal paste 231, 233, 235 and 237 are screened upon the thin sheets of ceramic material. Different $V_1$, $V_2$, and $V_3$ patterns are screened on in a rotating series as usual.

Figure 15:
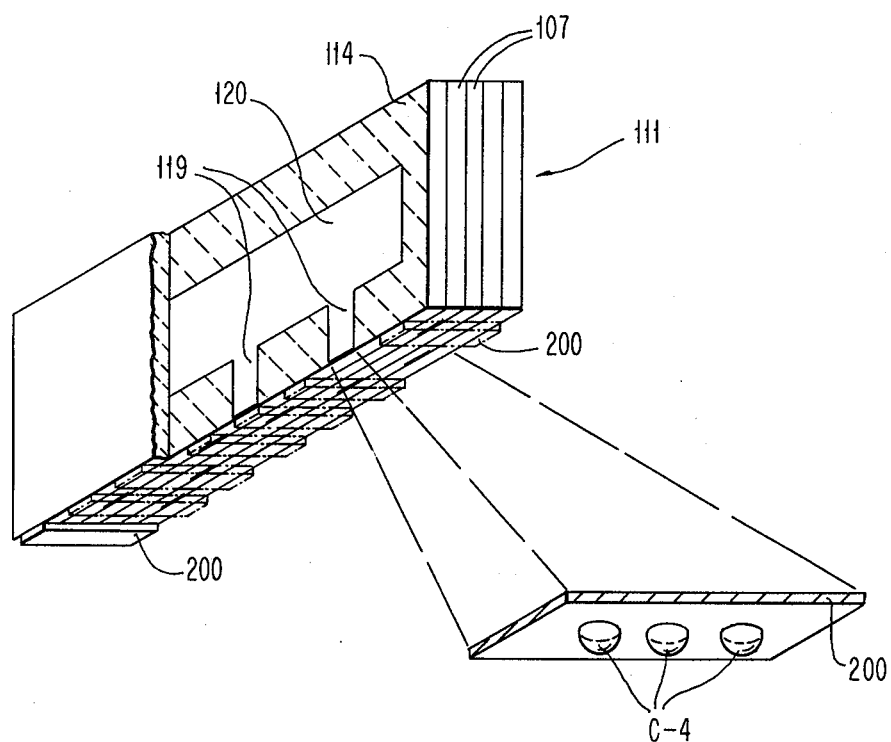
FIG. 15 shows a ceramic capacitor in accordance with this invention.

FIG. 15 shows a capacitor for mounting upon a chip carrier of the kind shown in FIGS. 8 and 9 which is basically similar to the capacitor stacks 11 in FIG. 1 with the exception that the stacks 111 are inverted and the tabs 119 are located upon only the lower surface of the capacitor stack. The stack is comprised of a number of laminates of ceramic and metallic material. The laminates include alternating layers of capacitor plates 120 and ceramic or dielectric sheets 114. The tabs 119 in a transverse array are connected by means of a metallic thin film strap 200 for each array. Each of the arrays is connected by C-4 solder ball joints to the pads on the chip carrier. This discrete capacitor upon the surface of a chip carrier offers substantial amounts of additional capacitance which will reduce the noise generated by the switching currents of the chips.

Having thus described our invention, what we claim as new and desire to secure by Letters Patent is:

1. In a module for supporting electronic circuit chips in a circuit including a planar ceramic substrate having first and second opposed surfaces;
    said first surface being adapted for carrying integrated circuit chips,
    a plurality of electrically conductive strips within said substrate, said strips being juxtaposed with each other and parallel to said surfaces of said substrate, said strips being employed for providing a plurality of electrical interconnections to integrated circuit chips on a first one of said opposed surfaces;
    a plurality of stacked capacitive elements contained within said substrate, composed of a plurality of laminated thin conductive sheets and a plurality of thin layers of dielectric material;
    each of said conductive sheets in said stack of capacitive elements being electrically connected to more than one of said plurality of conductive strips by means of coupling conductors distributed along the length of said capacitive elements within said substrate.

2. A module in accordance with claim 1 wherein said capacitive elements being located within a slot within said substrate with said conductive sheets sandwiched with said dielectric material whereby said conductive sheets form said stacked capacitive elements with each of said conductive sheets having a plurality of tabs extending up to contact said strips, said tabs comprising said conductors.

3. A module in accordance with claim 2 wherein said conductive sheets are flat, having large parallel surfaces and having edge surfaces, said sheets having high electrical capacitance between adjacent ones thereof and minimal inductive coupling therebetween, with the edge surfaces of said sheets facing outwardly from said slot towards said conductive strips.

4. A module in accordance with claim 1 wherein each of said coupling conductors is thin and elongated, said conductors being arranged in an array generally within said plane extending into contact with said strips, respectively;

said stacked capacitive elements extending parallel to said first and second surfaces of said substrate with each thereof connected to a plurality of said coupling conductors;

said thin elongated conductors extending through passages through said stacked capacitive elements with a plurality thereof being in electrical contact with a predetermined one of said capacitive elements at corresponding ones of said passages with a plurality of said conductors in a single plane being connected to the same one of said capacitive elements and the same one of said electrically conductive strips providing a plurality of parallel electrical connections therebetween.

5. A packaging module for electronic circuit chips including a planar substrate having opposed surfaces;

a plurality of stacked power distribution elements;

a plurality of land areas on a level adjacent to that of one surface of said substrate for mounting the interconnection to said chips;

said stacked power distribution elements being composed of a plurality of parallel, flat sheets having edges and large parallel surfaces with material between said sheets and with high electrical capacitance between said elements and minimal inductive coupling therebetween;

with at least one slot extending within said substrate between said opposed surfaces;

with said slot containing a stack of said elements extending therethrough with edge surfaces thereof facing outwardly through an opening of said slot and with at least some of said elements insulated electrically from said substrate;

the improvement comprising said sheets comprising dielectric material;

said material between said sheets comprising a thin film deposit of a metal;

with said high electrical capacitance existing between said thin film metal deposits and said substrate comprising a stack of laminated ceramic sheets, a plurality of conductive tabs on the periphery of said thin film metal deposits, a plurality of electrically conductive strips extending across the edges of said stack facing outwardly from said slots with each of said tabs from each one of said thin film deposits connected electrically to a different one of said conductive strips.

6. A module for supporting electronic circuit chips in a circuit including a planar substrate having a first surface adapted for carrying integrated circuit chips, with a plurality of conductive areas serving as pads for electrical and mechanical connections to said chips, the improvement comprising;

a capacitor comprising a solid structure having a base surface supported upon said first surface by bonding means, said bonding means providing electrical and mechanical connections to pads upon said first surface, said capacitor including a plurality of alternating layers of stacked laminated thin conductive sheets and a plurality of thin layers of dielectric material;

a plurality of conductive strips connected to the base of said capacitor with electrical and mechanical connections to said bonding means;

each of said conductive sheets having edge surfaces extending towards said base surface and said first surface with a plurality of tabs on said edge surfaces distributed along the length of said sheet, said tabs extending into electrical contact with different ones of said conductive strips;

whereby capacitive coupling between adjacent conductive sheets enhances the capacitive reactance of said module.

7. A capacitor comprising a solid structure with a base surface, alternating layers of a plurality of stacked laminated thin conductive sheets and a plurality of thin layers of dielectric material with the planes of said sheets extending towards said base surface;

a plurality of conductive strips connected to said base surface of said capacitive element;

said conductive sheets having edge surfaces with a plurality of tabs thereon distributed along the length thereof extending into electrical contact with different ones of said conductive strips;

whereby said capacitor has high distributed capacitance and low inductance.

8. A stack of capacitive elements composed of thin conductive sheets laminated with thin layers of dielectric material, an array of electrically conductive strips extending in juxtaposition with each other and integrally supported mechanically with said stack of capacitive elements, a plurality of conductors spaced apart connected between individual ones of said conductive sheets and said conductive strips, with each of said capacitive elements being connected to a plurality of said conductors along the length of said capacitive elements to provide a plurality of distributed current paths from said conductive sheets to said conductive strips.

9. A stack in accordance with claim 8 wherein the planes of the sheets are parallel to the planes of strips and said conductors extend through vias in said capacitive sheets with a said strip connected to a said capacitive sheet by a plurality of parallel ones of said conductors.

10. A stack in accordance with claim 8 wherein the planes of said sheets intersect the planes of said strips, and said conductors extend from the edges of said sheets into contact with said strips with a plurality of said conductors on each of said sheets extending into contact with a plurality of strips.

11. A stack in accordance with claim 10 wherein said conductors comprise tabs extending from the edge of said conductive sheets.

* * * * *